United States Patent
Okamoto

(10) Patent No.: US 6,899,558 B2
(45) Date of Patent: May 31, 2005

(54) SOCKET FOR ELECTRICAL PARTS

(75) Inventor: Tadayuki Okamoto, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 276 days.

(21) Appl. No.: 10/382,843

(22) Filed: Mar. 7, 2003

(65) Prior Publication Data
US 2003/0171021 A1 Sep. 11, 2003

(30) Foreign Application Priority Data
Mar. 11, 2002 (JP) .................................. 2002-065344

(51) Int. Cl.[7] .............................................. H01R 13/62
(52) U.S. Cl. .................................... 439/331; 439/330
(58) Field of Search ............................. 439/331, 330, 439/259, 264, 265, 266, 268, 342, 71, 72, 73; 257/48

(56) References Cited

U.S. PATENT DOCUMENTS

| | | | | |
|---|---|---|---|---|
| 4,815,987 A | * | 3/1989 | Kamano et al. | 439/268 |
| 5,254,012 A | * | 10/1993 | Wang | 439/263 |
| 6,106,319 A | * | 8/2000 | Fukunaga et al. | 439/342 |
| 6,296,138 B1 | * | 10/2001 | Hannah et al. | 439/268 |
| 6,350,138 B1 | * | 2/2002 | Atobe et al. | 439/266 |
| 6,371,783 B1 | * | 4/2002 | Ohashi et al. | 439/268 |
| 6,375,484 B1 | * | 4/2002 | Shimada | 439/330 |

* cited by examiner

Primary Examiner—Alexander Gilman
(74) Attorney, Agent, or Firm—Staas & Halsey LLP

(57) ABSTRACT

A socket for an electrical part comprises: a socket body on which an accommodation surface portion for accommodating the electrical part is provided; a plurality of contact pins provided on the socket body to be capable of contacting and separating from a terminal of the electrical part; and a movable plate relatively movable with respect to the socket body, the contact pin comprising an elastic piece which is elastically deformable and a contact portion provided on the front end portion of the elastic piece; the contact portion being displaced with the deformation of the elastic piece so as to separate the contact portion from the solder ball of the electrical part, wherein the solder ball is separated from the contact portion, when the solder ball is stuck to the contact portion, by abutting the solder ball against a back surface of the contact portion of another contact pin adjacent to the contact pin to which the solder ball is stuck.

7 Claims, 17 Drawing Sheets

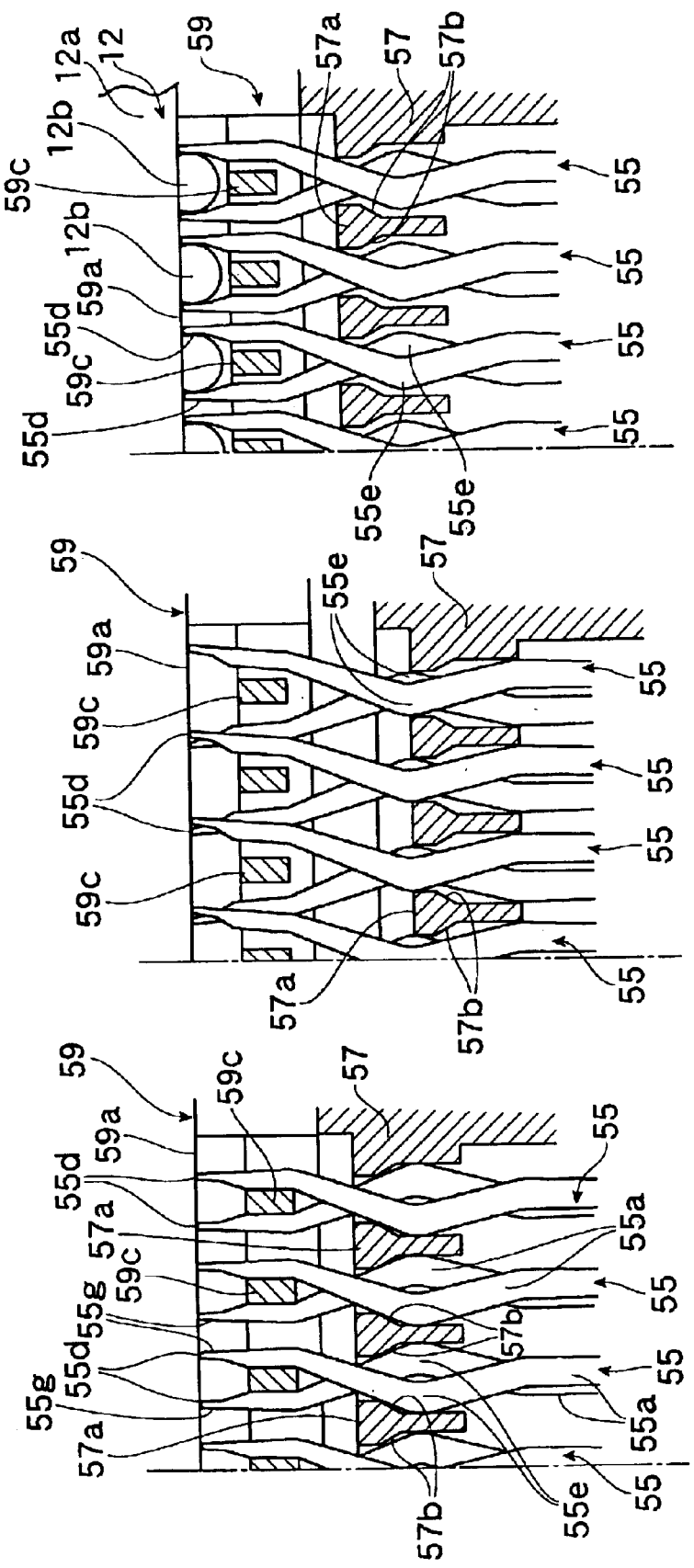

SOCKET FOR ELECTRICAL PARTS

BACKGROUND OF THE INVENTION

1. Field of the Invention

The present invention relates to a socket for electrical parts for detachably accommodating and holding an electrical part such as a semiconductor device (called as "IC package" hereinlater), and more particularly, the present invention relates to a socket for electrical parts that prevents a solder ball as a terminal of electrical parts from sticking to contact portions of contact pins.

2. Related Art of the Invention

As a conventional "socket for electrical parts" of this kind, there is provided an IC socket for detachably accommodating an IC package as an "electrical part".

The IC package includes, for example, a BGA (Ball Grid Array) type of IC package in which solder balls as a number of terminals are provided to the lower surface of the package body so as to protrude downward in a grid (lattice) arrangement.

The IC socket is provided with a contact pin having a pair of elastic pieces (paired elastic pieces), on each tip portion of which a contact portion is formed to contact and separate from a side surface portion of the solder ball of the IC package. And one of the elastic pieces is designed to be elastically deformed by being pushed with a movable plate that can slide laterally (transversely).

With making the movable plate slide, one of the paired elastic pieces of the contact pin is elastically deformed so as to widen the distance between a pair of contact portions (paired contact portions). Next, the solder ball is inserted into the widened space between the paired contact portions. Then the movable plate moves back to its original position, so that the contact portion of the one of the elastic pieces goes back toward its original position, thereby the solder ball is clamped by the paired contact portions to electrically connect the solder ball and the contact pin.

In this state described above, such performance test as a burn-in test is carried out. After the testing, the movable plate is slid, as described above, to displace the contact portion of the one of the elastic pieces so as to widen the distance between both contact portions of the contact pin. The paired contact portions are to be separated from the solder ball. Then the IC package is drawn off from the IC socket using, for example, an automated machine.

According to the above-mentioned structure, the IC package is designed to be able to be inserted in and drawn off from the IC socket, without applying extra force, by only sliding the movable plate, aiming to improve the operation efficiency significantly.

However, in such conventional IC packages as mentioned above, the solder balls often stick to some contact portions of the contact pins, because the solder balls are softened by the heat applied to the IC package of up to about 125° C. during the burn-in test. Under these conditions, the solder ball often remains stuck to one of the paired contact portions and do not separate from the contact portion even when the distance of both contact portions are widened by displacing the contact portion of one of the elastic pieces. In these situations, it is often the case that the IC package can not be drawn off from the IC socket without applying extra force on the IC package.

SUMMARY OF THE INVENTION

An object of the present invention is to substantially eliminate defects or drawbacks encountered in the related art mentioned above and to provide a socket for electrical parts capable of drawing off the electrical parts from the socket without substantially applying extra force and preventing the contact portion of the contact pin from sticking to the solder balls.

This and other objects can be achieved according to the present invention by providing a socket for electrical parts of the present invention described hereunder.

A first aspect of the present invention is characterized in that, a socket for an electrical part which comprises:

a socket body on which an accommodation surface portion is provided for accommodating the electrical part;

a plurality of contact pins provided on the socket body to be able to contact and separate from a terminal of the electrical part; and a movable plate relatively movable with respect to the socket body, the contact pin comprising an elastic piece which is elastically deformable and a contact portion provided on the elastic piece;

the contact portion being displaced with the elastic piece of the contact pin being elastically deformed by moving the movable plate, thereby separating the contact portion from the terminal of the electrical part, wherein the terminal is separated from the contact portion, in a case when the contact pin is elastically deformed in an opened direction of the elastic portion and the terminal is stuck to the contact portion, by abutting the terminal against another elastic portion of another contact pin adjacent to the contact pin to which the terminal is stuck.

Another aspect of the present invention is characterized in that said contact pin has a pair of elastic pieces, and a first elastic piece of the pair of elastic pieces is elastically deformed, by moving the movable plate laterally in a parallel manner with respect to the accommodation surface portion, to displace the contact portion of the first elastic piece.

Still another aspect of the present invention is characterized in that said contact pin has a pair of elastic pieces, both of the elastic pieces are elastically deformed, by moving vertically the movable plate, to displace each of the contact portions of the elastic pieces.

Further aspect of the present invention is characterized in that both contact portions of the pair of elastic pieces of said contact pin are each disposed at an opposite side to each other with respect to a center line which is extended along a displacement direction of the elastic pieces.

Further aspect of the present invention is characterized in that said contact pin has one elastic piece, the elastic piece is elastically deformed, by moving vertically the movable plate, to displace the contact portion of the elastic piece.

Further aspect of the present invention is characterized in that said electrical part is a BGA package.

According to the aspects of the present invention described above, the terminal of the electrical part which is likely to stick to the contact portion can be separated from the contact portion at the time the contact portion of the contact pin is displaced, because the elastic piece of another contact pin adjacent to the contact pin that sticks to the terminal is designed to abut against the terminal that sticks to the contact portion.

Therefore, the electrical part can be drawn off from the socket for electrical parts without applying extra force, and the terminal can be surely separated from the contact portion because the elastic piece is designed to directly push the terminal in order to separate the terminal from the contact portion. Furthermore the amount of the opening of the contact portion can be ensured larger even in a case when the pitch between one contact pin and another contact pin adjacent to the one contact pin becomes narrower, because the contact portion of the one contact pin is designed to pass by another contact portion of the another contact pin when contact portions are opened to their fullest extent.

The nature and further characteristic features of the present invention will be made more clear from the following descriptions made with reference to the accompanying drawings.

BRIEF DESCRIPTION OF THE DRAWINGS

In the accompanying drawings:

FIG. 13A is a sectional view showing an operation of the second embodiment in which a pair of contact portions of the contact pin are in a closed position;

FIG. 13B is a sectional view showing an operation of the second embodiment in which the pair of contact portions of the contact pin are in an opened position;

FIG. 13C is a sectional view showing an operation of the second embodiment in which the solder ball is in a state clamped by the contact portions of the contact pin;

DESCRIPTION OF THE PREFERRED EMBODIMENT

Figure 1:
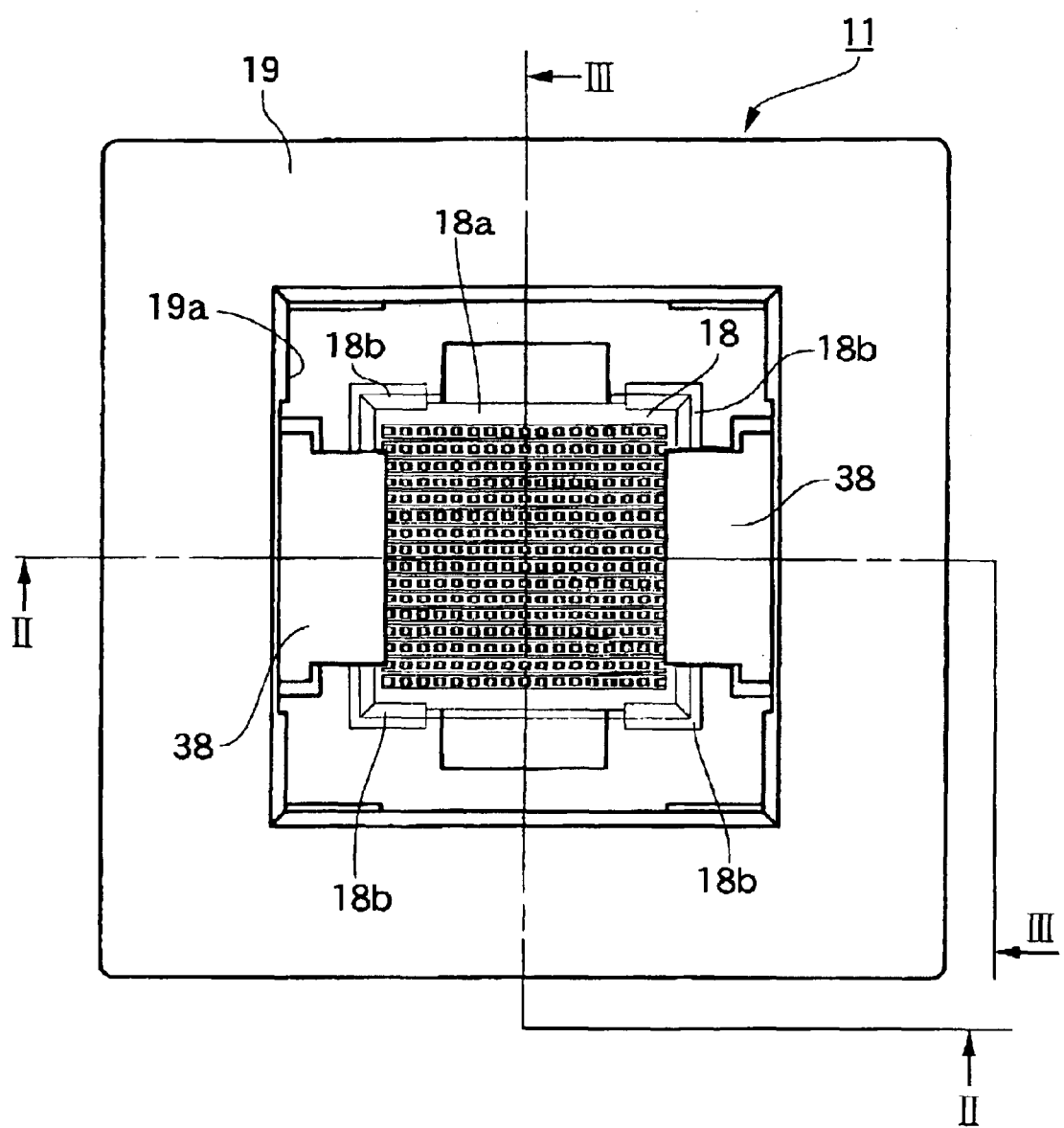
FIG. 1 is a plan view of an IC socket according to the first embodiment of the present invention.

A preferred embodiment of the present invention will be described hereunder with reference to the accompanying drawings.

Further, it is to be noted that the terms "upper", "lower", "vertical", "horizontal" and like described herein are used in the illustrated state or usable state of the socket or members associated herewith and also that a number of contact pins and terminals are actually arranged, though the description may be made with reference to single one thereof for the sake of easy understanding of the present invention.

First Embodiment of the Present Invention

FIGS. 1 to 8 show the first embodiment of the present invention.

An IC socket as a "socket for electrical parts" is totally designated by reference numeral 11, which is a device for establishing an electrical connection between a solder ball 12b as a "terminal" of an IC package 12 as an "electrical part" and a printed circuit board, not shown, of a tester, for example, for a performance test of the IC package 12.

Figure 4A:
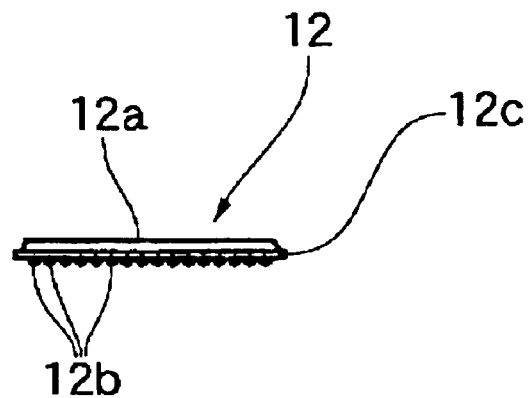
FIG. 4A is a front view of an IC package used for the embodiment of the present invention.
Figure 4B:
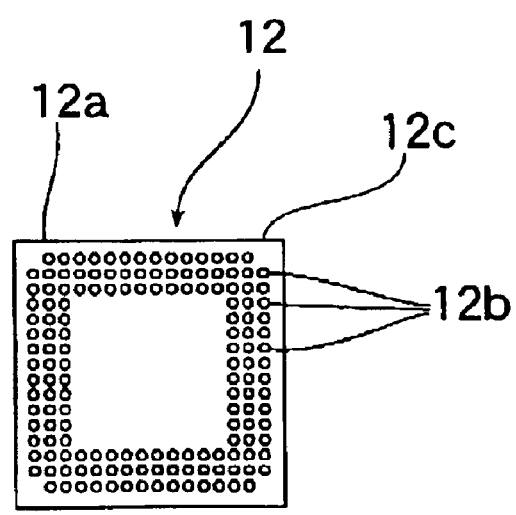
FIG. 4B is a bottom view of the IC package of FIG. 4A.

The IC package 12 is, for example, what is called a BGA (Ball Grid Array) type as shown in FIGS. 4A and 4B, in which a number of spherical-shape solder balls 12b are arranged to the lower surface of a rectangular package body 12a in a manner projecting in matrix arrangement.

Figure 2:
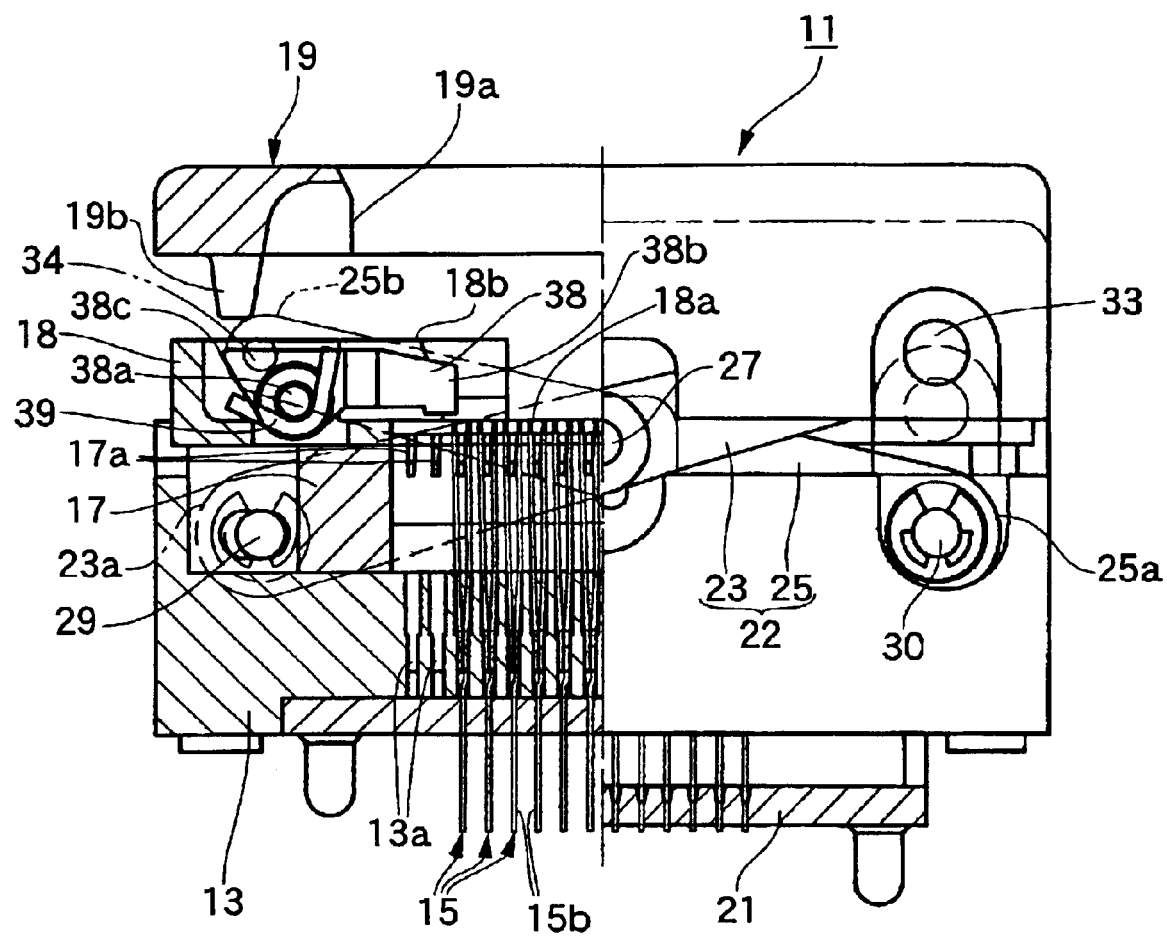
FIG. 2 is a sectional view taken along the line II—II of FIG. 1.

On the other hand, the IC socket 11 is generally including, as shown in FIG. 2, a socket body 13 to be mounted on the printed circuit board. A number of contact pins 15 to be contacted to or separated from the solder balls 12b, respectively, are provided for the socket body 13, and a slide plate 17 as a "movable plate" and a top plate 18 are layer-built in this order on the upper side of the socket body 13. In addition, on the upper side of the top plate 18 an operation member 19 is provided so as to slide the slide plate 17 in a lateral (transverse) direction.

Figure 5A:
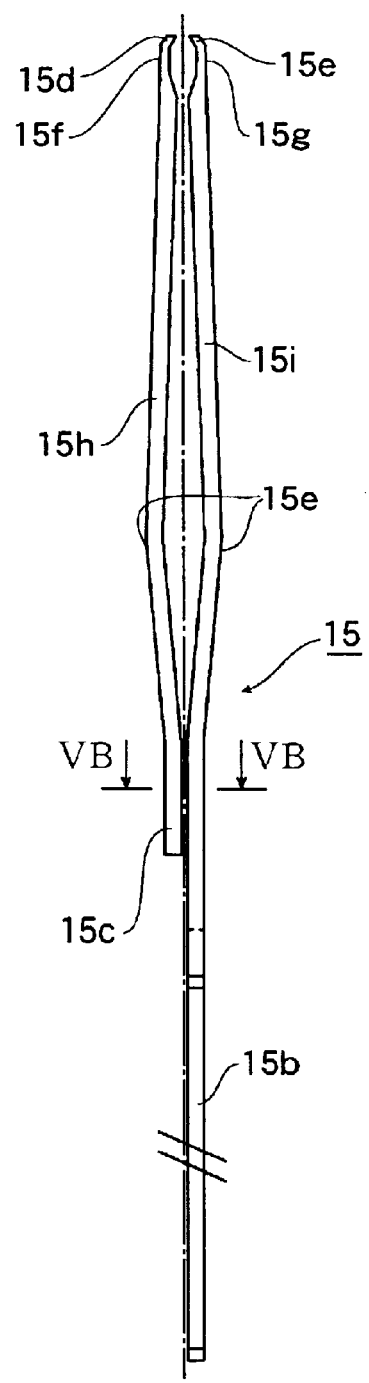
FIG. 5A is a front view of a contact pin according to the first embodiment of the present invention.
Figure 5B:
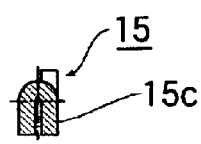
FIG. 5B is a sectional view taken along the line VB—VB of FIG. 5A.

Each contact pin 15 is formed, through press working, of a plate member having a good electrical conductivity and elastic property so as to provide a shape shown in FIGS. 5A and 5B.

More in detail, the contact pin 15 is composed of a fixed-side elastic piece 15h and a movable side elastic piece 15i (a pair of elastic pieces or a paired elastic pieces) at its upper portion, and a solder tail portion 15b at its lower portion. Each elastic piece 15h and 15i have a common base portion 15c at the lower portions thereof, as viewed in FIG. 5B, and the base portion 15c has substantially a U-shape so that the paired elastic pieces 15h and 15i are opposed to each other. A fixed-side contact portion 15d and a movable side contact portion 15e are further formed at each upper end (front end) portions of elastic pieces 15h and 15i so as to be contacted with and separated from the side portions of the solder ball 12b, and the solder ball 12b is clamped between the contact portions 15d and 15e.

Figures 6A, 6B, 6C:
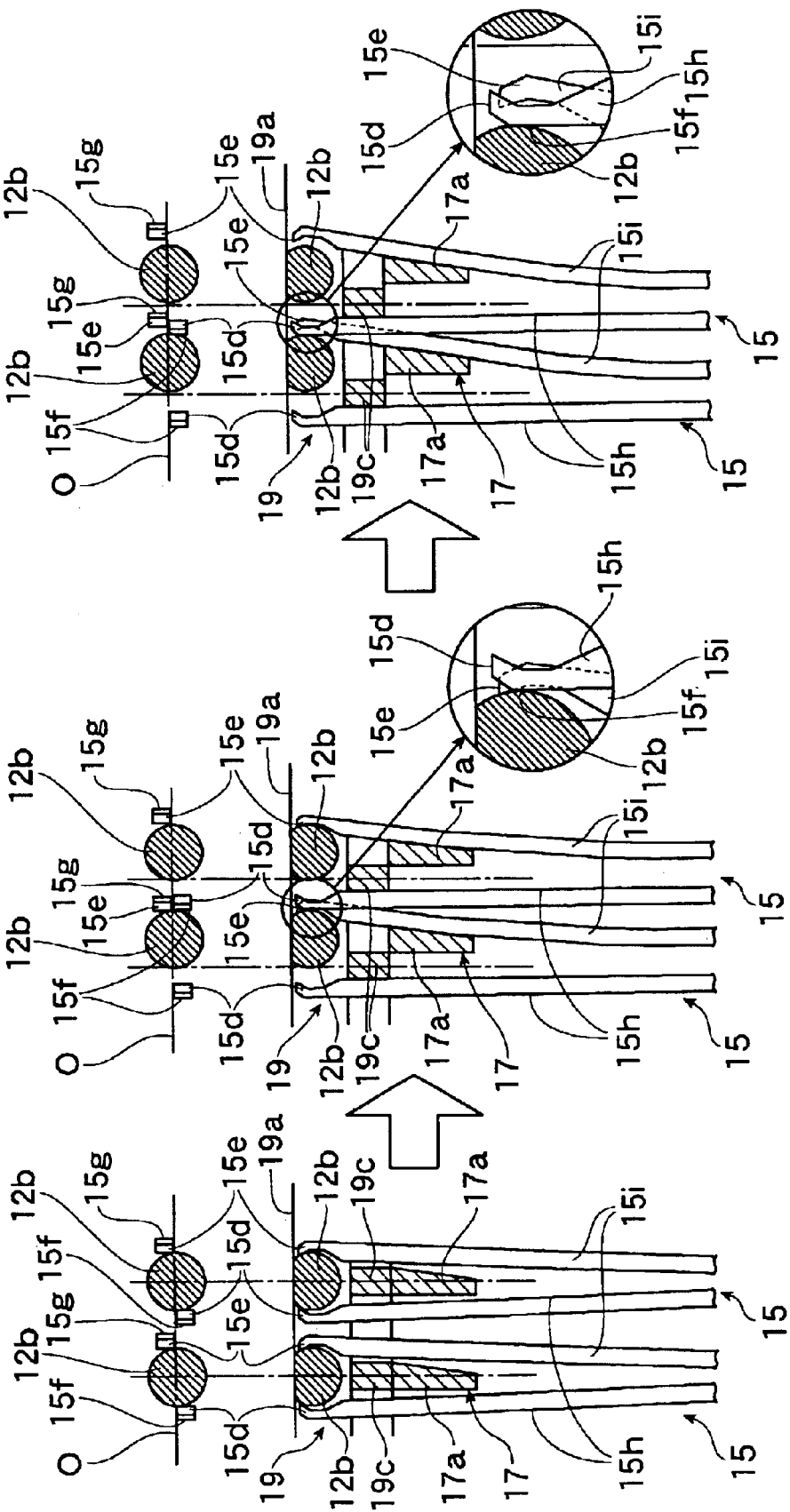
FIG. 6A is a sectional view of FIG. 1, showing an operation of the first embodiment, in which a solder ball is clamped by a pair of contact portions of the contact pin.
FIG. 6B is a sectional view of FIG. 1, showing an operation of the first embodiment, in which the pair of contact portion of the contact pin is in a process of opening.
FIG. 6C is a sectional view of FIG. 1, showing an operation of the first embodiment, in which the solder ball is separated from the contact portion of the contact pin.

Both contact portions (or paired contact portions) 15d and 15e, as shown in FIGS. 6A, 6B and 6C, in plan view, are each disposed at an opposite side to each other with respect to a center line O which passes through the center of the solder ball 12b and is parallel to a deformation direction of the movable side elastic piece 15i.

The solder tail portion 15b and the base portion 15c of the contact pin 15 of the structure mentioned above are press-fitted into a press-fit hole 13a formed in the socket body 13. The solder tail portion 15b projecting downward from the socket body 13 further extends downward through a location board 21, and then is inserted into a through hole formed in the printed circuit board (not shown) and soldered thereto, thus being connected thereto.

The slide plate 17 is provided slidably in the right and left direction in FIG. 2, FIGS. 6A, 6B, 6C and FIG. 7 (approximately parallel direction to the accommodation surface portion 18a of the top plate, which will be explained later). When the slide plate 17 is moved to slide, the movable side elastic piece 15i of the contact pin 15 provided in the socket body 13 is elastically deformed, thereby the movable side contact portion 15e being displaced in a predetermined distance.

In a case where the solder ball 12b of the IC package 12 sticks to the fixed-side contact portion 15d or the movable side contact portion 15e during displacing the movable side contact portion 15e of the contact pin 15, the solder ball 12b stuck to the fixed-side contact portion 15d or the movable side contact portion 15e is designed to be separated from the solder ball-stuck contact portion, by pushing the solder ball 12b with a back surface portion 15f, 15g of the fixed-side or movable side contact portion of another contact pin 15 adjacent to the solder ball-stuck contact pin 15.

In order to realize the mechanism mentioned above, the movable side contact portion 15e is designed to be able to move to a place where the movable side contact portion 15e passes over the fixed-side contact portion 15d of the another contact pin 15 adjacent to the solder ball-stuck contact pin 15, when the movable side contact portion 15e is opened to its fullest extent.

Figure 7:
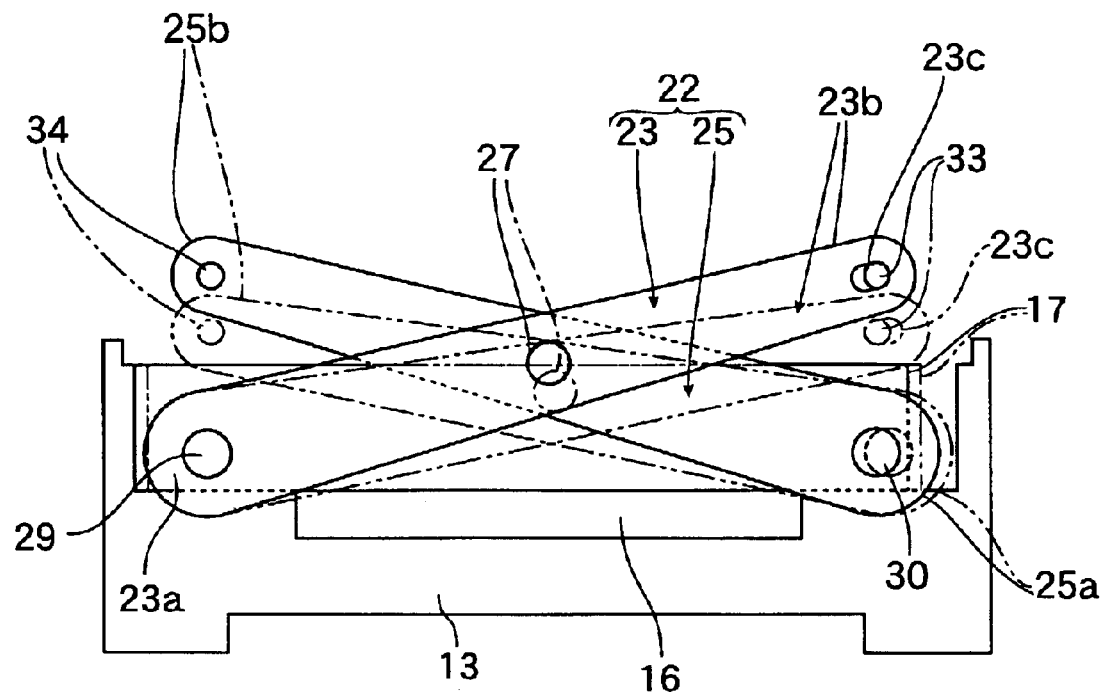
FIG. 7 is an explanatory sectional view showing an operation of X-shape link of the first embodiment.

The slide plate 17 is designed to slide in concert with the movement of an X-shaped link 22, as shown in FIG. 2 and FIG. 7, by vertically moving the operation member 19. On the slide plate 17, a pressing portion 17a is formed in order to push and elastically deform the movable side elastic piece 15i (see FIGS. 6A, 6B and 6C).

The X-shaped link 22 is provided on the both side surface portion which are provided along a slide direction of the quadrangular-shaped slide plate 17.

More specifically, the X-shaped link 22 has, as shown in FIG. 2 and FIG. 7, a first link member 23 and a second link member 25. These two link members have the same length and are connected rotatably by a central link pin 27.

A lower end portion 23a of the first link member 23 is connected rotatably to the socket body 13 by a lower end link pin 29. A lower end portion 25a of the second link member 25 is connected rotatably to one end portion of the side surface portion provided along the slide direction of the slide plate 17, by a lower end link pin 30. In addition, upper end portions 23b, 25b of the first and the second link members 23, 25 is connected rotatably to the operation member 19 by upper link pins 33, 34. An ellipsoidal opening 23c is formed at the upper end portion 23b of the first link member 23 that is connected to the operation member 17 through the ellipsoidal opening 23c by the upper link pin 33.

Figure 8:
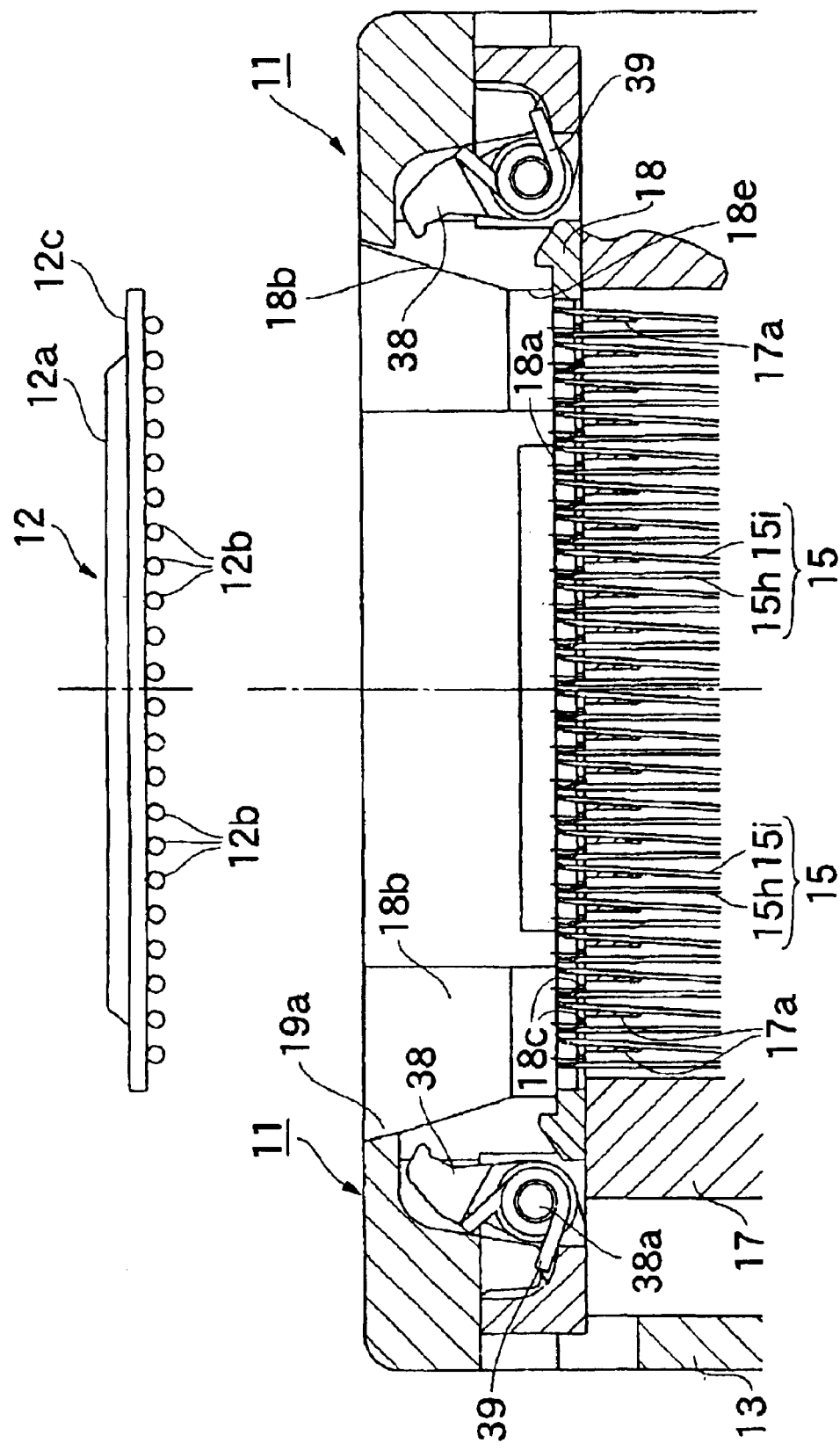
FIG. 8 is a sectional view showing a state where an operation member of the first embodiment is depressed.

Further, the top plate 18 has the accommodation surface portion 18a on which the IC package 12 is accommodated and a guide portion 18b, for guiding the IC package 12 to a predetermined position, at a place corresponding to each corner portion of a package body 12a, as shown in FIG. 1 and FIG. 8.

Further, the top plate 18 has a positioning portion 18c which is inserted between the pair of the contact portions 15d of each contact pin 15. When no external force is applied on both elastic pieces 15h, 15i of the contact pin 15 (two contact portions 15d are in a closed state), the positioning portion 18c is clamped by both elastic pieces 15h, 15i.

Figure 3:
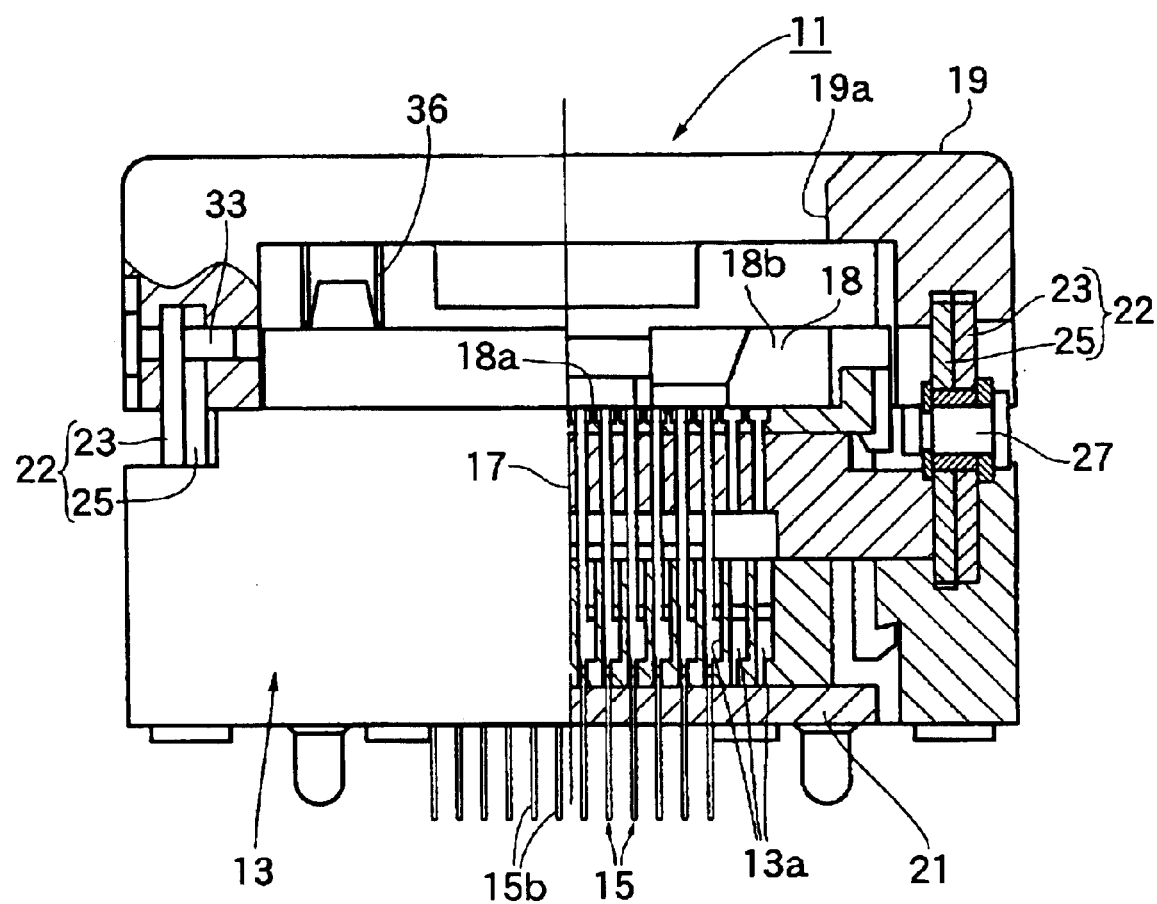
FIG. 3 is a sectional view taken along the line III—III of FIG. 1.

Further, as shown in FIGS. 1 and 2, the operation member 19 has an opening 19a having a size capable of inserting the IC package 12. Through the opening 19a, the IC package 12 is inserted and accommodated, at a predetermined position, on the accommodation surface portion 18a of the top plate 18. The operation member 19, as shown in FIG. 3, is provided vertically movable with respect to the socket body 13 and urged upward by a spring 36, and is further provided with an operational projecting portion 19b for rotating a latch 38.

As shown in FIG. 8 etc., the latch 38 is attached to the socket body 13 to be rotatable around an axis 38a and urged by a spring 39 toward the center of the socket body 13 in FIG. 8, being designed to push down a peripheral portion 12c of the IC package body 12a with a pressing portion 38b formed at a tip end portion of the latch.

Furthermore, the latch 38 has a pressed portion 38c which is designed to be pressed by the operational projecting portion 19b of the operation member 19. When the operation member 19 is depressed, the pressed portion 38c is pressed by the operational projecting portion 19b, and the latch 38 is rotated toward outside from the socket 13 in FIG. 8, thereby the pressing portion 38b being retracted from a position where the IC package 12 is accommodated.

Next, operation of the socket for electrical parts will be explained hereunder.

In order to accommodate the IC package 12, using an automated machine, on each IC socket 11 many of which are previously arranged on the printed circuit board, at first the operation member 19 is depressed. With this operation, the slide plate 17 is slid toward the right side by way of the X-shaped link 22 as shown by the chain double dashed line in FIG. 7. And the movable side elastic piece 15i of the contact pin 15 is pressed, by the pressing portion 17a of the slide plate 17, to be elastically deformed. On the other hand, the fixed-side elastic piece 15h is remained at a predetermined position by the positioning portion 18c of the top plate 18.

According to the operation mentioned above, the pair of contact portions 15d, 15e of the contact pin 15 are made opened.

In the above mentioned structure, the fixed-side contact portion 15d is positioned at a side opposite to the movable side contact portion 15e with respect to the center line O (as shown in FIGS. 6A, 6B and 6C, in plan view). In a state where the movable side elastic piece 15i is fully opened, the movable side contact portion 15e is designed to pass by another fixed-side contact portion 15d of another contact pin 15 adjacent to the contact pin 15 so that the amount of opening of the movable elastic piece 15i (moving distance of the movable elastic piece 15i) can be larger than that of the conventional contact pin.

At the same time, the pressed portion 38c of the latch 38 is pressed by the operational projecting portion 19b of the operation member 19, to be rotated anti-clockwise in FIG. 2 against the urging force of the spring 39. Thereby the pressing portion 38b is displaced to the recess position (see FIG. 8).

In this state, the IC package 12 carried by the automated machine is guided by the guide portion 18b and accommodated at a predetermined position on the accommodation surface portion 18a of the top plate 18. And each solder ball 12b of the IC package 12 is inserted in non-contact manner into an opened space between the pair of contact portions 15d of each contact pin 15.

Next, when force applied downward on the operation member 19 is released, the operation member 19 is moved upward by the urging force of the spring 36. Then the slide plate 17 is slid toward the left side in FIGS. 6A, 6B and 6C through the X-shaped link 22 so that the latch 38 is rotated clockwise in FIG. 2 by the urging force of the spring 39.

When the slide plate 17 is slid toward left side in FIGS. 6A, 6B and 6C, the pressing force toward the movable side elastic piece 15i of the contact pin 15 is released so that the movable side elastic piece 15i can return back toward its original position. Accordingly the solder ball 12b is clamped between the contact portion 15d of the movable side elastic piece 15i and the contact portion 15d of the fixed-side elastic piece 15h (see FIG. 6A). When the solder ball 12b is clamped, the fixed-side elastic piece 15h is elastically deformed slightly and slightly displaced toward a direction in which the contact portion 15d of the fixed-side elastic piece 15h is widened.

According to the movement of the socket mentioned above, each solder ball 12b of the IC package 12 is electrically connected to the printed circuit board through the contact pin 15.

The IC package 12 thus accommodated on the IC socket 11 which is mounted on the printed circuit board is set up in a burn-in bath. Then the burn-in test of the IC package 12 is carried out by increasing the temperature in the bath to, for example, about 125° C. With increasing the temperature in the bath, the solder ball 12 is softened so that the side surface portion of the solder ball 12b often sticks to the movable side contact portion 15e or the fixed-side contact portion 15d.

After the burn-in test, the IC package 12 is taken out from its accommodated position by depressing the operation member 19. In concert with the move of the operation member 19, as mentioned above, the slide plate 17 is slid toward right side from the position shown in FIG. 6A, to a position in FIG. 6B, to a position in FIG. 6C. Accordingly the movable side elastic piece 15i is elastically deformed toward right side and the contact portion 15e of the movable side elastic piece 15i is displaced toward right side in these Figures. At this moment, if the solder ball 12b sticks to the movable side contact portion 15e, the IC package 12 is moved to slide toward right side in Figures, with the movement of contact portion 15e, so that the solder ball 12b is separated from the fixed-side contact portion 15d of the fixed-side elastic piece 15h (see FIG. 6B).

Then each solder ball 12b abuts against the back surface portion 15f of the fixed-side contact portion 15d of another contact pin 15 which is adjacent to the contact pin 15, on which the solder ball is sticking.

The movable side contact portion 15e of the movable side elastic piece 15i is designed to be further displaced beyond the position where the solder ball 12b is in the abutting condition against the back surface portion 15f mentioned above. Therefore if the movable side contact portion 15e of the movable side elastic piece 15i is further displaced toward right side in FIGS. 6A, 6B and 6C, by elastically displacing the movable side elastic piece 15i, the solder ball 12b is pressed by the back surface portion of the fixed-side contact portion 15d. Accordingly, the solder ball 12b is separated from the movable side contact portion 15e (see FIG. 6C).

On the contrary, when the solder ball 12b sticks to the fixed-side contact portion 15d of one contact pin, the back surface portion of another movable side contact portion 15e of another contact pin, which is adjacent to the one contact pin, abuts against the solder ball 12b. From this state, by further displacing another movable side contact portion 15e toward the opening direction thereof, another movable side contact portion 15e presses the solder ball 12b. Accordingly, the solder ball 12b is separated from the fixed-side contact portion 15d.

From the foregoing structure mentioned above, the solder ball 12b can be separated from the fixed-side contact portion 15d or the movable side contact portion 15e even if the solder ball 12b sticks to either of the fixed-side contact portion 15d or the movable side contact portion 15e.

Especially, the solder ball 12b can be surely separated (detached) from the contact portion 15d, 15e, because the back surface portion 15f, 15g of each contact portion 15d, 15e directly press each solder ball 12b.

As mentioned above, the pair of contact portions 15d, 15e are separated from the solder ball 12b of the IC package 12 so that the IC package 12 can be drawn off from the IC socket 11 without applying any extra force using an automated machine.

Second Embodiment of the Present Invention

FIGS. 9 to 16B show the second embodiment of the present invention.

In the first embodiment described above, the present invention is applied to what is called a single swing type contact pin (only one elastic piece of the contact pin (only one elastic piece of the paired elastic pieces) is deformed elastically by transverse (lateral) slide of the slide plate 17). But the second embodiment is applied to what is called a two swing type contact pin (both elastic pieces of the contact pins are deformed elastically by vertical moving of the slide plate).

Specifically, the IC socket 51 of the second embodiment has a socket body 53 mounted on a printed circuit board. The socket body 53 has a contact pin 55 which contacts and separates from each solder ball 12b and a movable plate 57 which displaces the contact pin 55. Further, on the upper side of the movable plate 57, an upper plate 59 is fixed to the socket body 53. Still further an operation member 61 is provided which is designed to move the movable plate 57 vertically.

Figure 12:
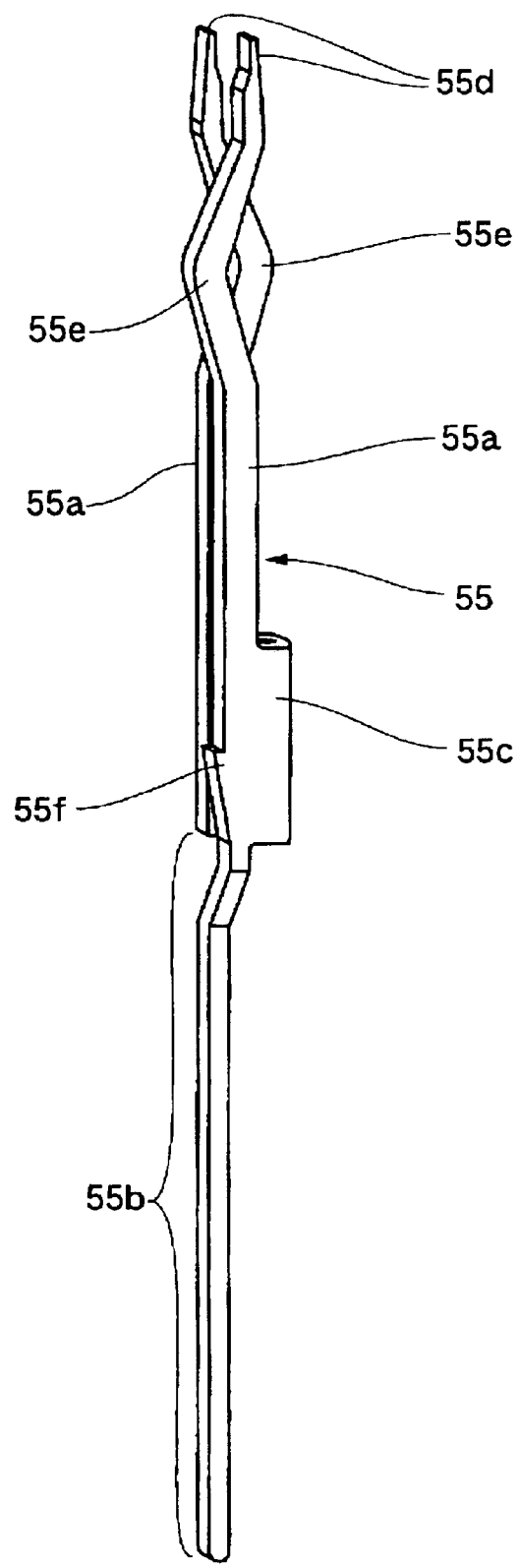
FIG. 12 is a perspective view of the contact pin of the second embodiment.

The contact pin 55 is formed from a plate having an elastic springy property and electric conductivity through press working and has a shape as shown in FIG. 12 etc.

Figure 14A:
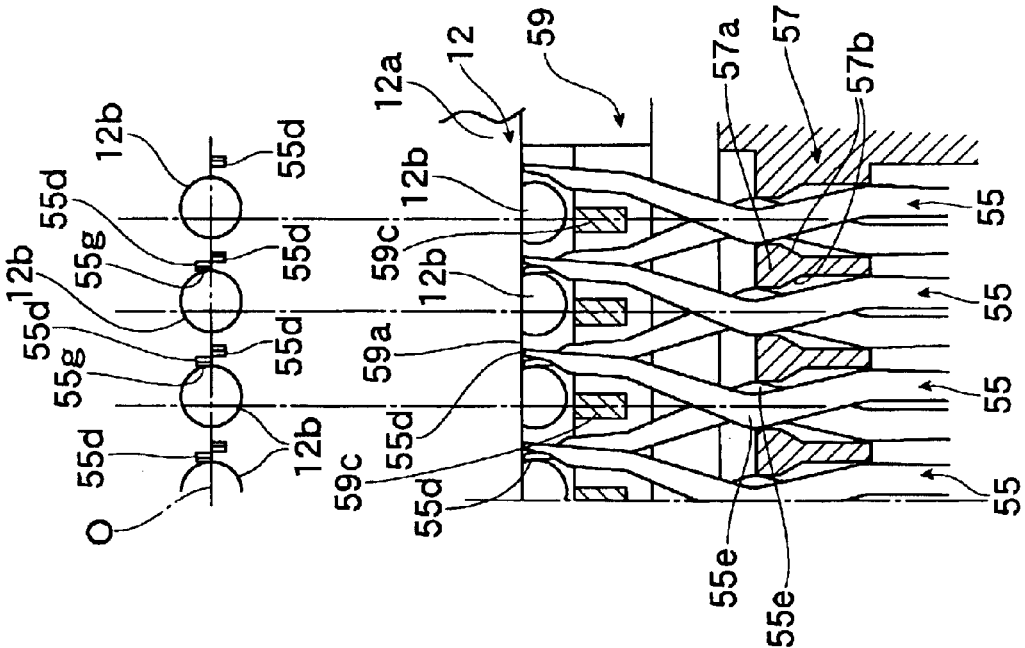
FIG. 14A is a sectional view showing an operation of the second embodiment in which the solder ball is in a state clamped by the contact portions of the contact pin.
Figure 14B:
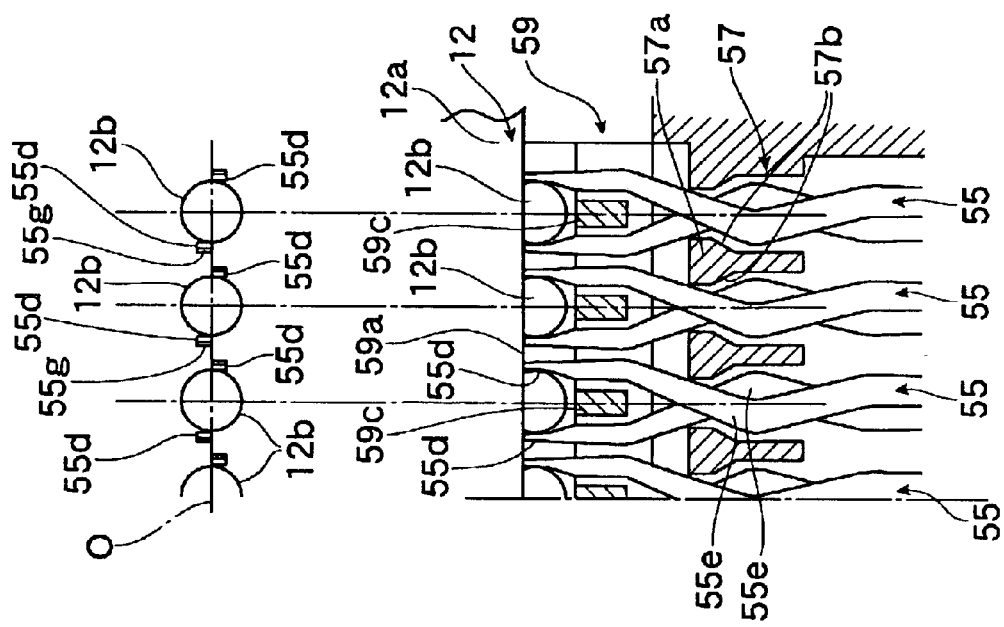
FIG. 14B is a sectional view showing an operation of the second embodiment in which the solder ball is in a state separated from the contact portions of the contact pin.

More specifically, a piece of elastic pieces 55a are formed in an approximately upper half portion of the contact pin 55, and a solder tail portion 55b is formed in an approximately lower half portion thereof. The pair of elastic pieces (the paired elastic pieces) 55a are formed to be positioned opposite to each other by folding a base portion 55c of a lower end portion thereof to have approximately U shape. And at each upper end portion (upper tip end portion), a contact portion 55d is formed which contacts and separates from a side surface portion of the solder ball 12b of the IC package 12, so that the solder ball 12b is clamped by the two contact portions (the paired contact portions). As shown in FIGS. 14A and 14B, the paired contact portions 55d are each positioned opposite to each other with respect to a center line O which passes through the center of the solder ball 12b and is parallel to a deformation direction of the elastic pieces 55a.

Each elastic piece of the paired elastic pieces 55a of the contact pin 55 has a bent portion 55e which is bent approximately in the shape of "<" and these bent portions of the contact pin are positioned opposite to and crossed with each other as shown in FIG. 12, as will be described later, these bent portions 55e are designed to be pressed by a cam portion 57a so that the two contact portions 55d can be moved away from each other.

The distance between the paired contact portions 55d, when the paired contact portions are opened to their fullest extent, is designed to make the solder ball 12b separate (detach) from the contact portions 55d, by making one contact portion of one contact pin pass by another contact portion of another contact pin which is adjacent to the one contact pin 55 and by making a back surface portion 55g of the another contact portion 55d of the another contact pin 55 push the solder ball 12b which sticks to the contact portion 55d.

The base portion 55c and the solder tail portion 55b of the contact pin 55 is press-fitted into a press fit hole 53a formed in the socket body 53 and the portion 55f formed at the base portion 55c is bitten into the socket body 53, so that the contact pin 55 is prevented from dropping out upwards from the socket body. The solder tail portion 55b projecting downward from the socket body 53 is further projecting downward through a locate board 66 and inserted into each through hole of the printed circuit board (not shown) and connected by soldering thereto.

Figure 11:
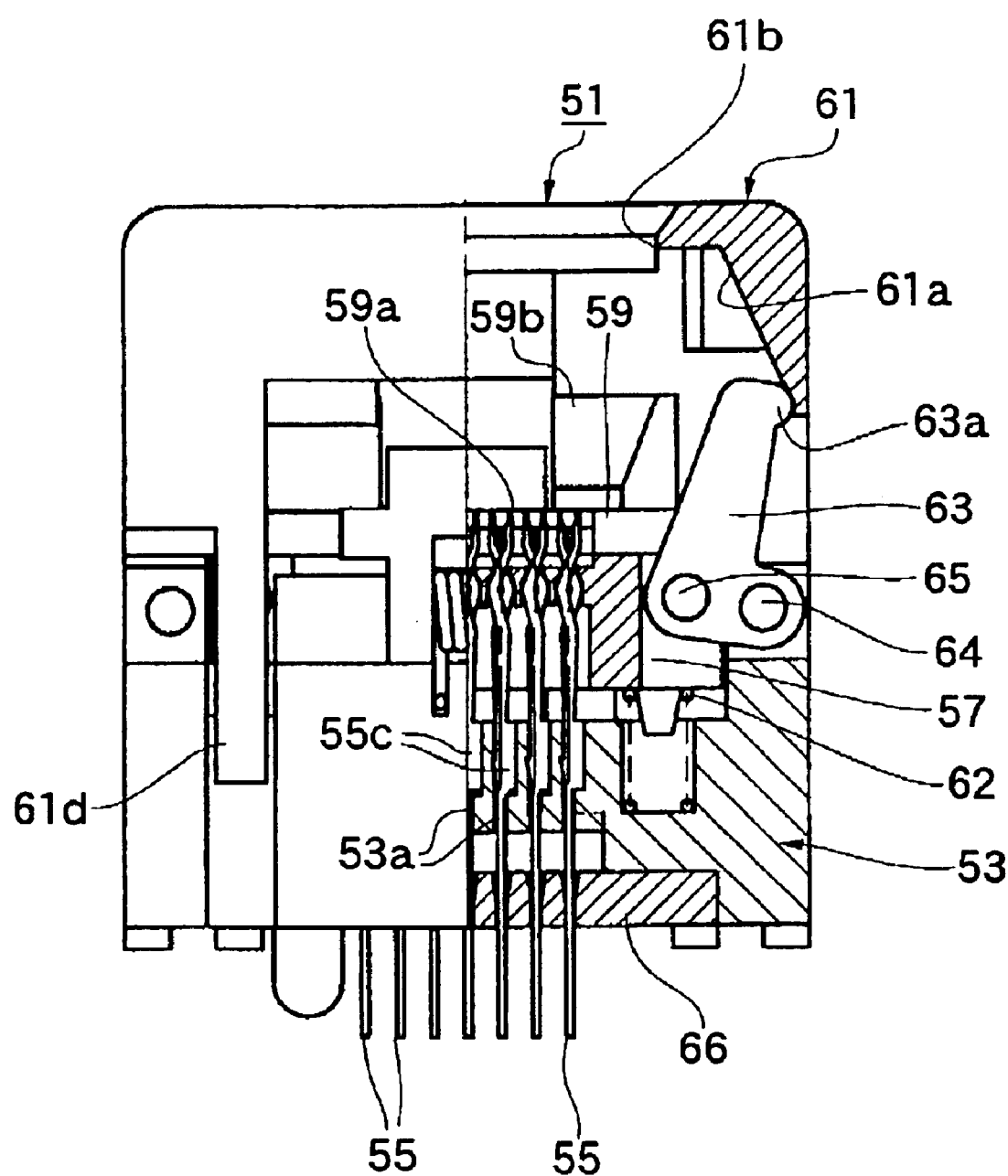
FIG. 11 is a sectional view taken along the line XI—XI of FIG. 9.

Further, the movable plate 57, as shown in FIG. 11, is provided on the socket body 53 to be vertically movable and urged upward by a spring 62. A pair of arms 63 for moving the movable plate 57 vertically is also provided (one of the paired arms 63 is not shown in FIG. 11). The arm 63 is attached to the socket body 53 by an axis 64 and also rotatably attached to the movable plate 57 by an axis 65. An upper end portion 63a of the arm 63 is slidably engaging with a cam surface 61a of the operation member 61. According to the structure mentioned above, when the operation member 61 is depressed, the arm 63 is rotated around the axis 64 anti-clockwise in FIG. 11 by being pressed with the cam surface 61a, thereby the movable plate 57 is moved downward.

As shown in FIGS. 13A, 13B, 13C and 14A and 14B, the movable plate 57 has cam portions 57a which are disposed between each contact pin 55. At both side portions of the cam portions 57a, sliding surfaces 57b are provided and are designed to press the bent portions 55e of the elastic pieces 55a of the contact pins 55 adjacent to each other on both sides of the cam portion. In other words, one cam portion 57a is designed to press the bent portions 55e of the elastic pieces 55a of both adjacent contact pins 55. Both bent portions 55e of the paired elastic pieces 55a of the contact pin 55 are designed to be pressed, by a pair of cam portions 57a positioned each at both sides of the contact pin 55, to come close to each other, so that the paired contact portions 55d can be made opened (or the distance between the paired contact portions can be made longer).

Figure 9:
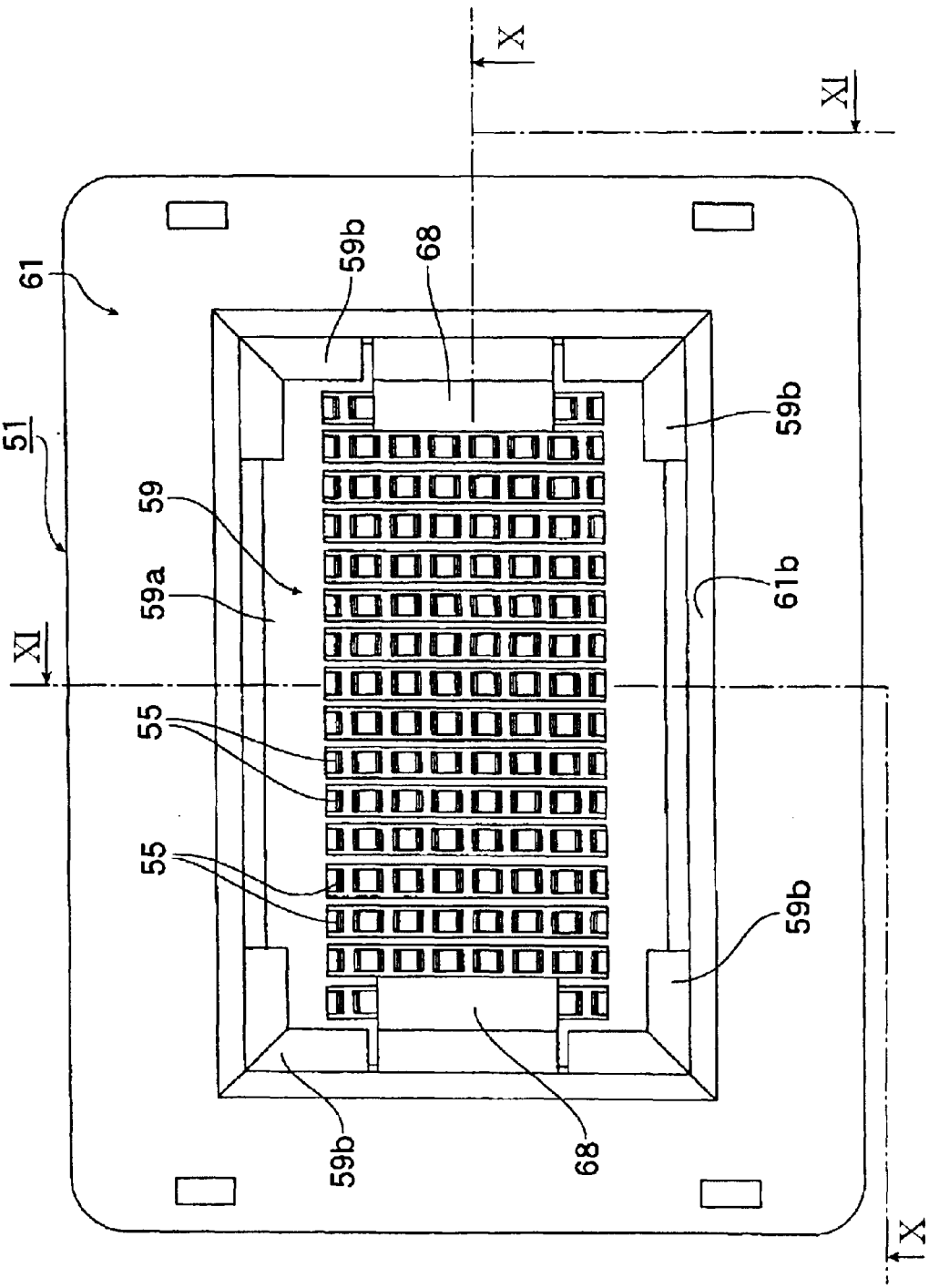
FIG. 9 is a plan view of the IC socket of a second embodiment of the present invention.

The upper plate 59 has an accommodation surface portion 59a on which the IC package 12 is accommodated and a guide portion 59b for guiding the IC package 12 to a predetermined position. The guide portion 59b is provided at a place corresponding to each corner portion of the package body 12a as shown in FIG. 9. Furthermore, the upper plate 59 has a positioning rib 59c which is inserted between the paired contact portions 55d of each contact pin 55. The positioning rib 59c is clamped between the paired elastic pieces 55a when no external force is applied on the paired elastic pieces 55a of the contact pin 55 (the paired contact potions 55d is in a closed state).

Figure 10:
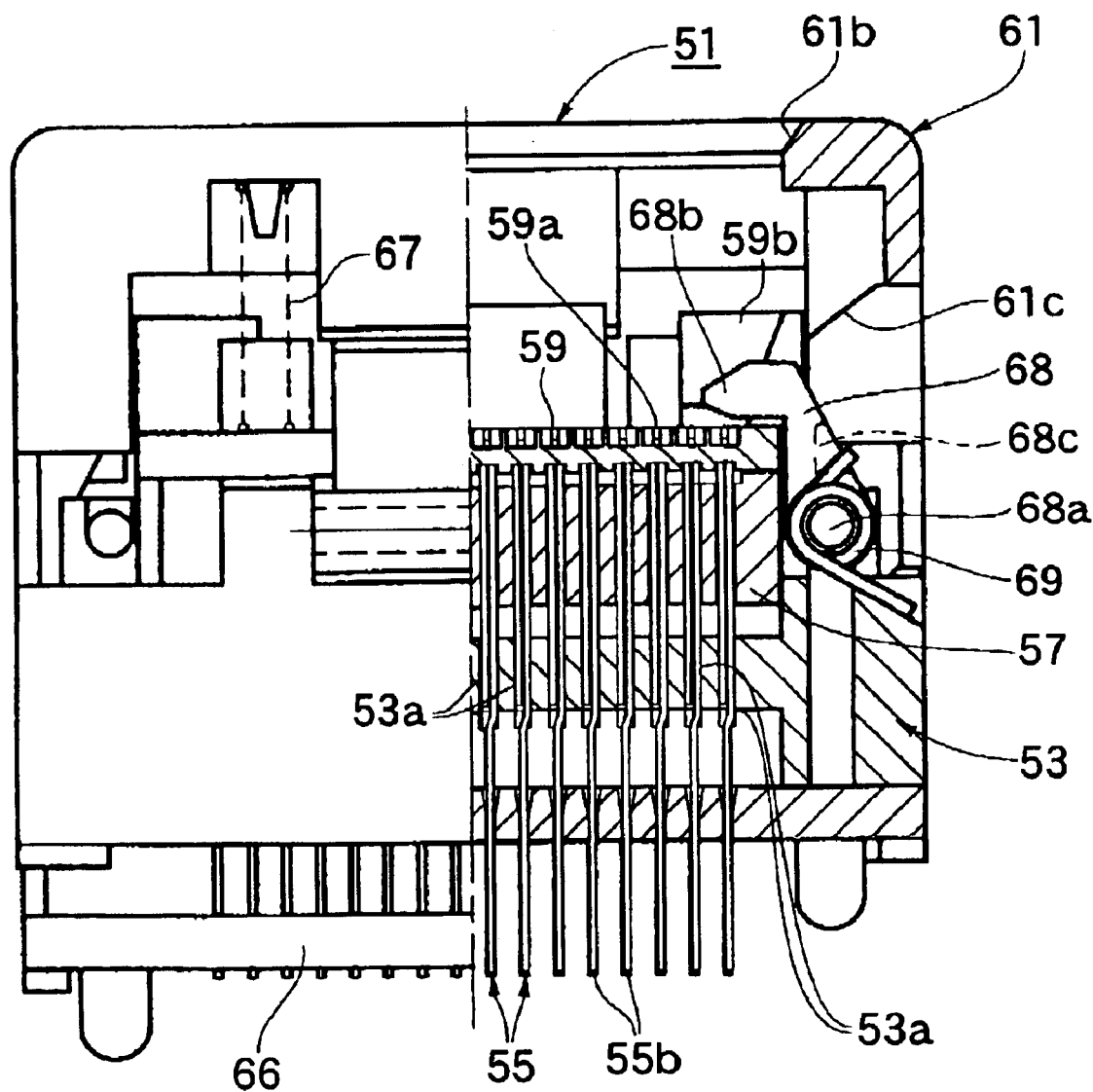
FIG. 10 is a sectional view taken along the line X—X of FIG. 9.

Further, the operation member 61, as shown in Figures, has an opening 61b wide enough to insert the IC package 12. Through the opening 61b, the IC package 12 is inserted and accommodated at a predetermined position on the accommodation surface portion 59a of the upper plate 59. The operation member 61 is, as shown in FIGS. 10 and 11, is provided to be vertically movable with respect to the socket body 53 and urged upward by a spring 67. An engaging claw 61d is engaged with an engaged portion of the socket body 53 at its maximum elevated position of the operation member 61, so that the operation member 61 can be prevented from coming off.

Figure 16A:
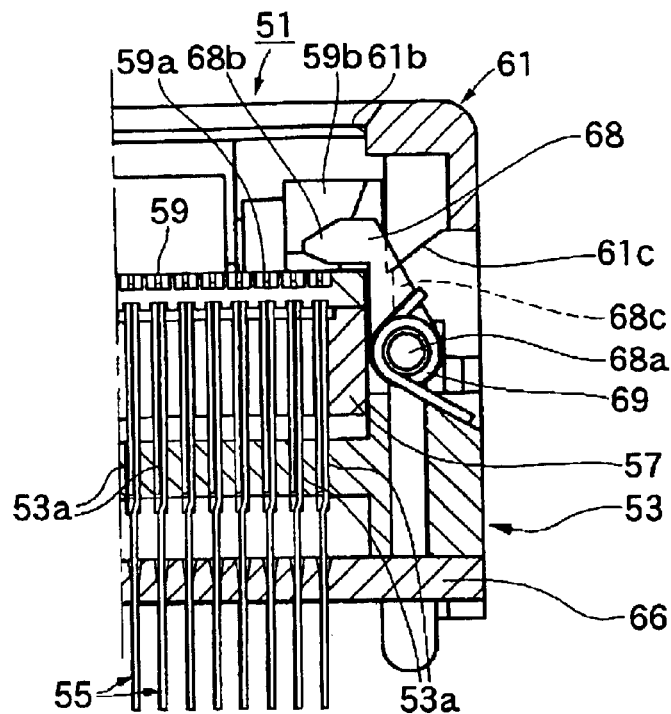
FIG. 16A is a sectional view showing an operation of the second embodiment in which the operation member is in an elevated position.
Figure 16B:
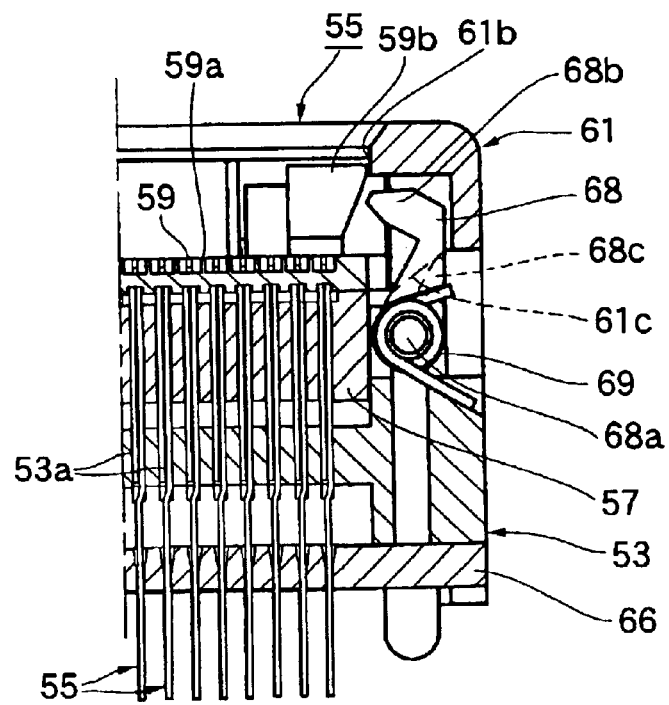
FIG. 16B is a sectional view showing an operation of the second embodiment in which the operation member is in a depressing position.

Further the operation member 61 has a cam surface 61a for rotating the arm 63 and an operation portion 61c for rotating a latch 68 as well, as shown in FIGS. 16A and 16B.

The latch 68, as shown in FIGS. 16A and 16B etc., is attached to the socket body 53 by an axis 68a and can move around the axis 68a. The latch 68 is urged by a spring 69 anti-clockwise and designed to hold a peripheral portion of the IC package 12 with a pressing portion 68b formed at a tip end portion thereof.

Further, the latch 68 has a pressed portion 68c on which the operation portion 61c of the operation member 61 slides. When the operation member 61 is depressed, the pressed portion 68c slides on the operation portion 61c, to rotate the latch 68 clockwise as shown in FIG. 16B. Thus the pressing portion 68b retracts (moves) from the accommodation position of the IC package 12.

Next, the operation of the second embodiment will be explained.

Figure 15:
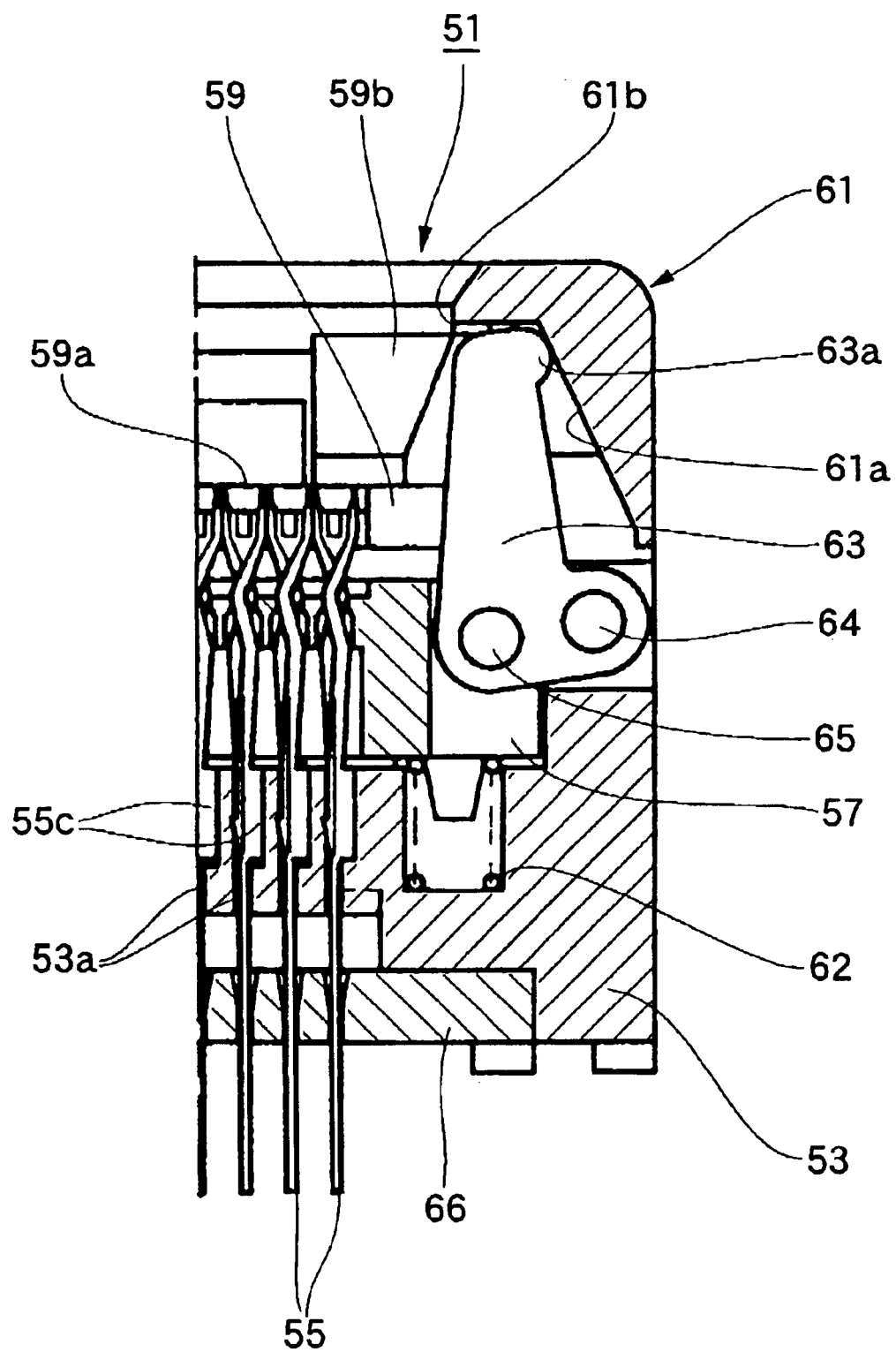
FIG. 15 is a sectional view showing a state an operation member of the second embodiment is depressed.

In order to accommodate the IC package 12 on the IC socket 51, the operation member 61 is first depressed. With this operation, the arm 63 is rotated anti-clockwise, as shown in FIG. 15, by the cam surface 61a of the operation member 61, so that the movable plate 57 is depressed. With the downward movement of the movable plate 57, from the state shown in FIG. 13A to the state shown in FIG. 13B, the cam portion 57a is also depressed to push (press) the bent portion 55e of one contact pin 55 by the sliding surface 57b of the cam portion 57a. Thus the paired contact portions (a pair of contact portions of the contact pin) 55d are opened as shown in FIG. 13B.

At this moment, each contact portion 55d of the one contact pin 55 passes by each contact portion of another contact pin which is adjacent to the one contact pin, to crisscross with each other, so that a necessary distance between the paired contact portion (the amount of opening of the paired contact portion) 55d of the contact pin, at the time the paired contact portions are opened, can be ensured even in a case when the pitch of the contact pin arrangement is made narrower.

In addition, the operation portion 61c of the operation member 61 pushes the pressed portion 68c of the latch 68 so that the latch 68 is rotated clockwise against the urging force of the spring 69, from the state shown in FIG. 16A to the state shown in FIG. 16B. Thereby the pressing portion 68b is retracted to a recess position.

At this stage, the IC package 12 is guided along the guide portion 59b and accommodated to a predetermined position on the accommodation surface portion 59a of the upper plate 59. And each solder ball 12b of the IC package 12 is inserted between the opened paired contact portions 55d of each contact pin 55 without contacting the paired contact portions.

Thereafter, with releasing the downward pressing force applied to the operation member 61, the operation member 61 is moved upward by the urging force of the spring 67 etc. and the movable plate 57 is moved upward by the spring 62. Then the latch 68 is rotated anti-clockwise in FIGS. 16A and 16B by the urging force of the spring 69.

When the movable plate 57 is moved upward, the pressing force applied on the bent portion 55e of the contact pin 55 by the cam portion 57a is removed so that the paired contact portions 55d moves to a closing (narrowing) direction, thereby the solder ball 12b is clamped by the paired contact portions 55d (see FIG. 13C).

Thus, each solder ball 12b of the IC package 12 and the printed circuit board are electrically connected through the contact pin 55.

When the IC package 12 is taken out from the accommodation state, the operation member 61 is depressed to open the paired contact portions 55d of the contact pin 55. At this stage, if a solder ball 12b sticks to either side of the paired contact portions, the IC package 12 is moved together with the contact portion 55d which sticks to the solder balls 12b.

When the paired contact portions 55d are further opened from the above mentioned state, the solder ball 12b is pushed by the back surface portion of the contact portion 55d of the adjacent contact pin 55 as shown in FIG. 14B. Thus the solder ball 12b is separated from the contact portion 55d to which the solder ball 12b sticks.

In this state the IC package 12 can be taken out easily with weaker force than the conventional state where the solder ball 12b is clamped by the paired contact portion 55d.

Accordingly, even in a case that a solder ball 12b sticks to a contact portion, the solder ball 12b can be separated from the contact portion 55d without increasing the number of parts for the socket, because the back surface portion of another contact portion 55d of another contact pin 55 adjacent to the contact pin to which the solder ball 12b sticks is designed to push the solder ball 12b.

Third Embodiment of the Present Invention

Figure 17A:
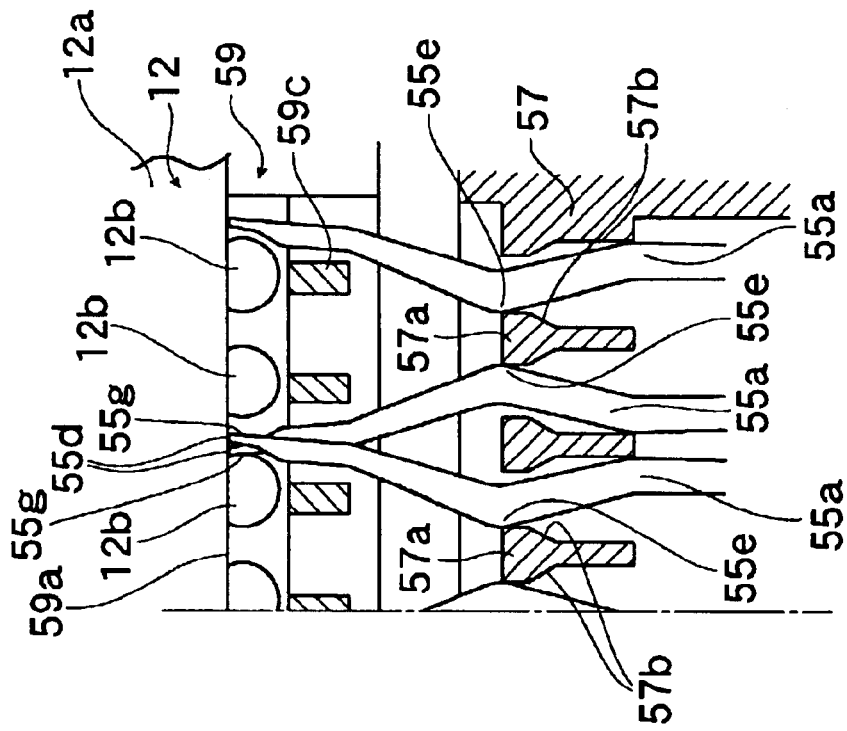
FIG. 17A is a sectional view showing an operation of a third embodiment in which the contact portion of the contact pin is in a state contacted with the solder ball.
Figure 17B:
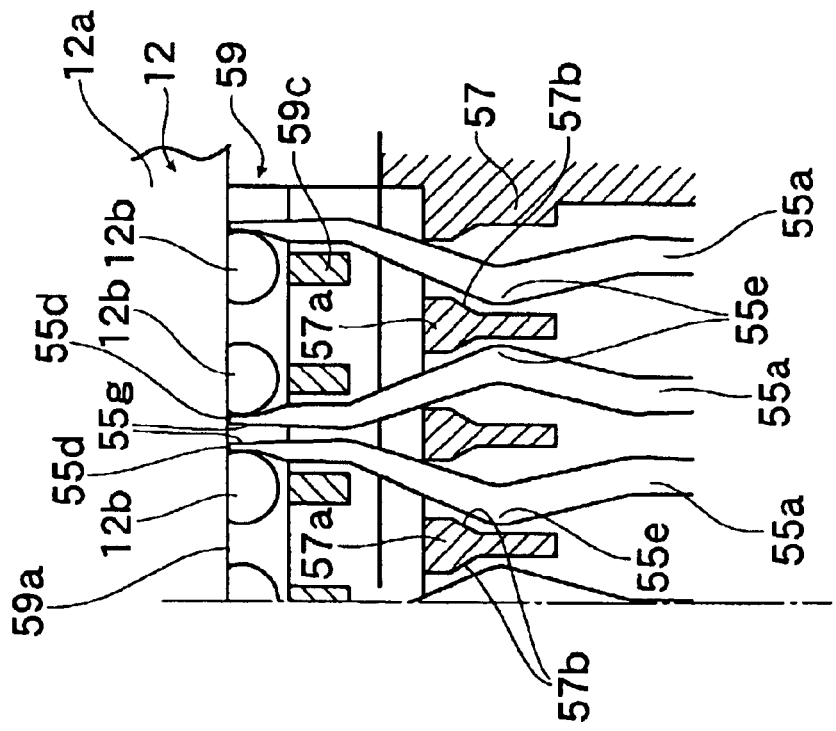
FIG. 17B is a sectional view showing an operation of the third embodiment in which the solder ball is in a state separated from the contact portion of the contact pin.

FIGS. 17A and 17B show the third embodiment of the present invention.

In the second embodiment mentioned above, a pair of elastic pieces 55a are formed on each contact pin 55, but in the third embodiment only one elastic piece 55a is formed on each contact pin 55.

In the third embodiment, the solder ball 12b can be separated (detached) from one contact portion 55d to which the solder ball 12b sticks, because the back surface portion of another contact portion 55d of another contact pin 55 adjacent to the one contact pin, is designed to push the solder ball 12b (see FIG. 17B).

The embodiment mentioned above can all be used for an IC socket 11 as a "socket for electrical parts", the present invention however is not limited to such an IC socket and can also be applicable to other devices or like.

What is claimed is:

1. A socket for an electrical part which comprises:
   a socket body on which an accommodation surface portion is provided for accommodating the electrical part;
   a plurality of contact pins provided on the socket body to be able to contact and separate from a terminal of the electrical part; and
   a movable plate relatively movable with respect to the socket body,
   the contact pin comprising an elastic piece which is elastically deformable and a contact portion provided on the elastic piece;
   the contact portion being displaced with the elastic piece of the contact pin being elastically deformed by moving the movable plate, thereby separating the contact portion from the terminal of the electrical part,
   wherein the terminal is separated from the contact portion, when the contact pin is elastically deformed in an opened direction of the elastic portion and the terminal is stuck to the contact portion, by abutting the terminal against another elastic portion of another contact pin adjacent to the contact pin to which the terminal is stuck.

2. The socket for an electrical part according to claim 1, wherein the contact pin has a pair of elastic pieces, and a first elastic piece of the pair of elastic pieces is elastically deformed, by moving the movable plate laterally in a parallel manner with respect to the accommodation surface portion, to displace the contact portion of the first elastic piece.

3. The socket for an electrical part according to claim 1, wherein the contact pin has one elastic piece, the elastic piece is elastically deformed, by moving vertically the movable plate, to displace the contact portion of the elastic piece.

4. The socket for an electrical part according to claim 1, wherein the contact pin has a pair of elastic pieces, both of the elastic pieces are elastically deformed, by moving vertically the movable plate, to displace each of the contact portions of the elastic pieces.

5. The socket for an electrical part according to claim 2, wherein both contact portions of the pair of elastic pieces of the contact pin are each disposed at an opposite side to each other with respect to a center line which is extended along a displacement direction of the pair of the elastic pieces.

6. The socket for an electrical part according to claim 1, wherein the electrical part is a BGA package.

7. The socket for an electrical part according to claim 4, wherein both contact portions of the pair of elastic pieces of the contact pin are each disposed at an opposite side to each other with respect to a center line which is extended along a displacement direction of the pair of the elastic pieces.

* * * * *